(12) United States Patent
Liao et al.

(10) Patent No.: US 8,440,526 B2
(45) Date of Patent: May 14, 2013

(54) METHOD OF FABRICATING MEMORY

(75) Inventors: Hsiu-Han Liao, Hsinchu (TW); Lu-Ping Chiang, Hsinchu (TW)

(73) Assignee: Winbound Electronics Corp., Taichung (TW)

( * ) Notice: Subject to any disclaimer, the term of this patent is extended or adjusted under 35 U.S.C. 154(b) by 109 days.

(21) Appl. No.: 13/241,239

(22) Filed: Sep. 23, 2011

(65) Prior Publication Data
US 2013/0078775 A1    Mar. 28, 2013

(51) Int. Cl.
*H01L 21/336* (2006.01)

(52) U.S. Cl.
USPC ............. 438/258; 438/775; 257/E21.302

(58) Field of Classification Search .......... 438/596, 438/776, 777; 257/E21.302, E21.683
See application file for complete search history.

(56) References Cited

U.S. PATENT DOCUMENTS

| 6,074,914 | A | 6/2000 | Ogura | |
|---|---|---|---|---|
| 6,417,051 | B1 * | 7/2002 | Takebuchi | 438/287 |
| 6,468,838 | B2 * | 10/2002 | Chien et al. | 438/142 |
| 7,563,726 | B2 * | 7/2009 | Cho et al. | 438/769 |

\* cited by examiner

*Primary Examiner* — Chandra Chaudhari
(74) *Attorney, Agent, or Firm* — Jianq Chyun IP Office

(57) ABSTRACT

A method of fabricating a memory is provided. A substrate including a memory region and a periphery region is provided. A plurality of first gates is formed in the memory region and a plurality of first openings is formed between the first gates. A nitride layer is formed on the substrate in the memory region, and the nitride layer covers the first gates and the first openings. An oxide layer is formed on the substrate in the periphery region. A nitridization process is performed to nitridize the oxide layer into a nitridized oxide layer. A conductive layer is formed on the substrate, and the conductive layer includes a cover layer disposed on the substrate in the memory region and a plurality of second gates disposed on the substrate in the periphery region. The cover layer covers the nitride layer and fills the first openings.

10 Claims, 4 Drawing Sheets

METHOD OF FABRICATING MEMORY

BACKGROUND OF THE INVENTION

1. Field of the Invention

The invention relates to a method of fabricating a memory.

2. Description of Related Art

The dimension of a flash memory is gradually reduced. Therefore, in order to resolve the issue of the decreasing line width and prevent misalignment of the contacts, a self-aligned contact (SAC) process and a self-aligned floating gate (SAF) process are performed in a memory region of the flash memory.

When the SAC process or the SAF process is performed in the memory region of an exemplary flash memory, the SAC process or the SAF process is likely to complicate the entire manufacturing process performed in the peripheral region, and the SAC process or the SAF process may contain thermal processes. Thereby, characteristics of devices in the peripheral region may be deteriorated. For instance, the characteristics of gates may be impaired, or boron penetration may occur in a gate oxide layer. Temperature and other parameters of the thermal process thus need to be adjusted. Namely, in consideration of the characteristics of devices in the peripheral region, the favorable conditions of performing the manufacturing process on the devices in the memory region may be compromised. As such, the device characteristics of the memory cannot be further improved.

SUMMARY OF THE INVENTION

The invention is directed to a method of fabricating a memory. By applying the method, devices in the memory can have favorable characteristics.

In an embodiment of the invention, a method of fabricating a memory is provided. In the method, a substrate that includes a memory region and a peripheral region is provided. A plurality of first gates is formed in the memory region, and a plurality of first openings is formed between the first gates. A nitride layer is formed on the substrate in the memory region, and the nitride layer covers the first gates and the first openings. An oxide layer is formed on the substrate in the peripheral region. A nitridization process is performed to nitridize and to transform the oxide layer into a nitridized oxide layer. A conductive layer is formed on the substrate. The conductive layer includes a cover layer and a plurality of second gates. The cover layer is located on the substrate in the memory region, and the second gates are located on the substrate in the peripheral region. The cover layer covers the nitride layer. The first openings are filled with the cover layer.

Based on the above, in the method of fabricating the memory, the gates in the peripheral region are formed after the devices including the gates are formed in the memory region, and thereby the manufacturing process performed in the memory region is unlikely to affect the characteristics of devices in the peripheral region. As such, the silicidation process can also be performed in the memory, and the characteristics of devices in the memory can be improved.

Several exemplary embodiments accompanied with figures are described in detail below to further describe the invention in details.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles of the disclosure.

DESCRIPTION OF EMBODIMENTS

FIG. 1A to FIG. 1I are schematic cross-sectional flow charts illustrating a method of fabricating a memory according to an embodiment of the invention.

Figure 1A:
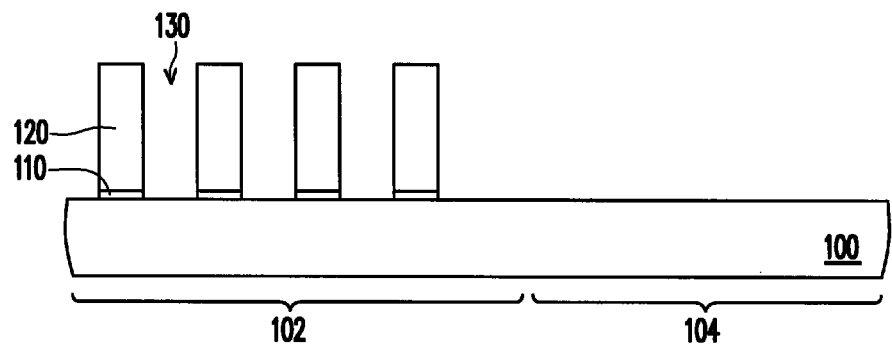
FIG. 1A to FIG. 1I are schematic cross-sectional flow charts illustrating a method of fabricating a memory according to an embodiment of the invention.

With reference to FIG. 1A, a substrate 100 is provided. The substrate 100 includes a memory region 102 and a peripheral region 104. A plurality of first gates 120 is formed in the memory region 102, and a plurality of first openings 130 is formed between the first gates 120. In this embodiment, a gate dielectric layer 110 is further formed between each of the first gates 120 and the substrate 100. The substrate 100 is, for instance, a semiconductor substrate, such as an n-type or a p-type silicon substrate, a group III-V semiconductor substrate, and so forth. The gate dielectric layer 110 is, for instance, made of silicon oxide/silicon nitride/silicon oxide (ONO). A material of the first gates 120 is, for instance, doped polysilicon.

Figure 1B:
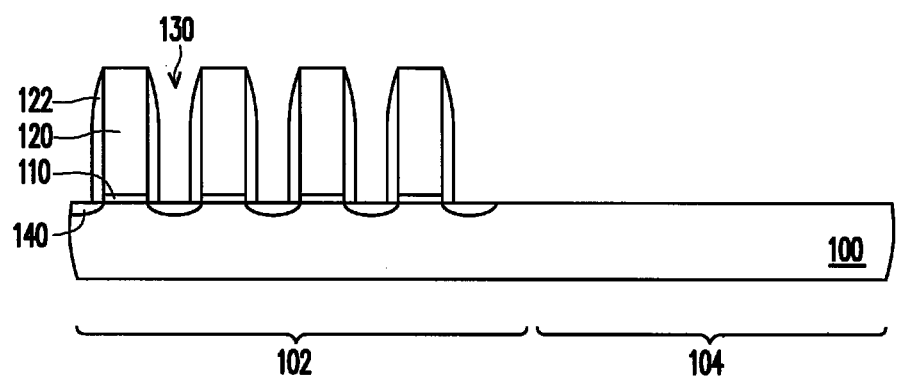

With reference to FIG. 1B, a source and drain region 140 is formed at two sides of each of the first gates 120. A spacer 122 is formed on a sidewall of each of the first gates 120. In this embodiment, the source and drain regions 140 are formed by ion implantation, for instance. A method of forming the spacers 122 includes deposition and etching, for instance. According to an embodiment of the invention, another spacer can be formed on the spacer 122. Note that devices including the gates and the gate oxide layer are not formed in the peripheral region 104 when the first gates 120, the source and drain regions 140, and the spacers 122 are formed in the memory region 102. Therefore, the thermal process, the doping process, or other processes performed in the memory region 102 do not affect the characteristics of devices in the peripheral region 104.

Figure 1C:
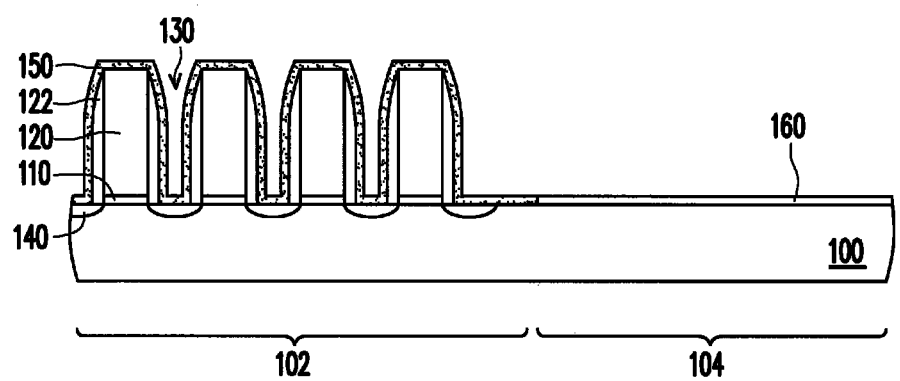

With reference to FIG. 1C, a nitride layer 150 is formed on the substrate 100 in the memory region 102, and the nitride layer 150 covers the first gates 120. According to this embodiment, a material of the nitride layer 150 is, for instance, silicon nitride, and a method of fabricating the nitride layer 150 is, for instance, chemical vapor deposition (CVD).

An oxide layer 160 is formed on the substrate 100 in the peripheral region 104. According to this embodiment, a material of the oxide layer 160 is, for instance, silicon oxide, and a method of fabricating the oxide layer 160 is, for instance, CVD.

Figure 1D:
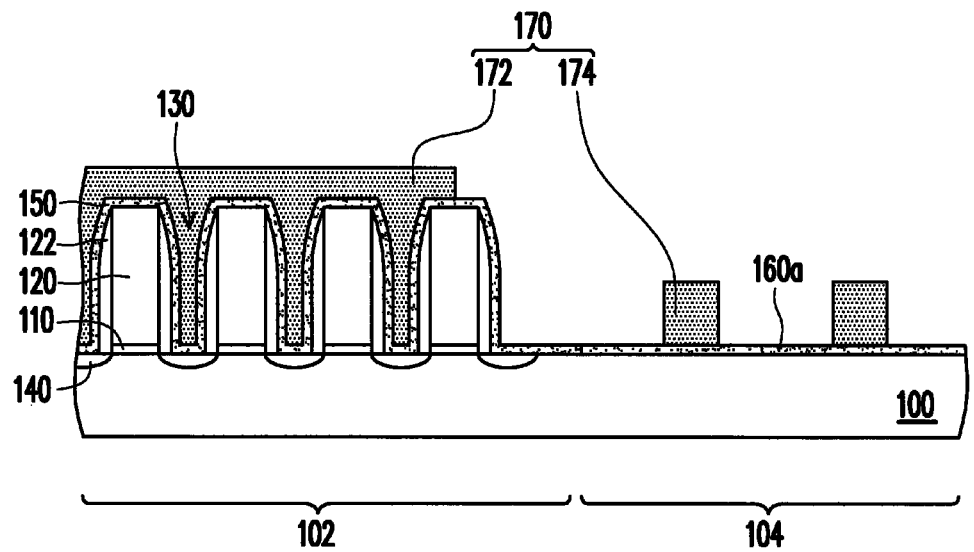

With reference to FIG. 1D, a nitridization process is performed on the substrate 100, such that the oxide layer 160 is nitridized and transformed into a nitride-rich nitridized oxide layer 160a. The nitridization process, for instance, includes a decoupled plasma nitridization (DPN) process, a post-nitridization annealing (PNA) process, or a nitrogen ion implantation process. Note that the nitridized oxide layer is conducive to suppression of boron penetration in subsequent processes.

A conductive layer 170 is formed on the substrate 100. The conductive layer 170 includes a cover layer 172 and a plurality of second gates 174. The cover layer 172 is located on the substrate 100 in the memory region 102, and the second gates 174 are located on the substrate 100 in the peripheral region 104. The cover layer 172 covers the nitride layer 150. The first openings 130 are filled with the cover layer 172. A material of the conductive layer 170 includes undoped polysilicon, for instance. In an embodiment of the invention, the second gates 174 serve as a mask layer to form a lightly-doped region (not shown) at two sides of each of the second gates 174.

Figure 1E:
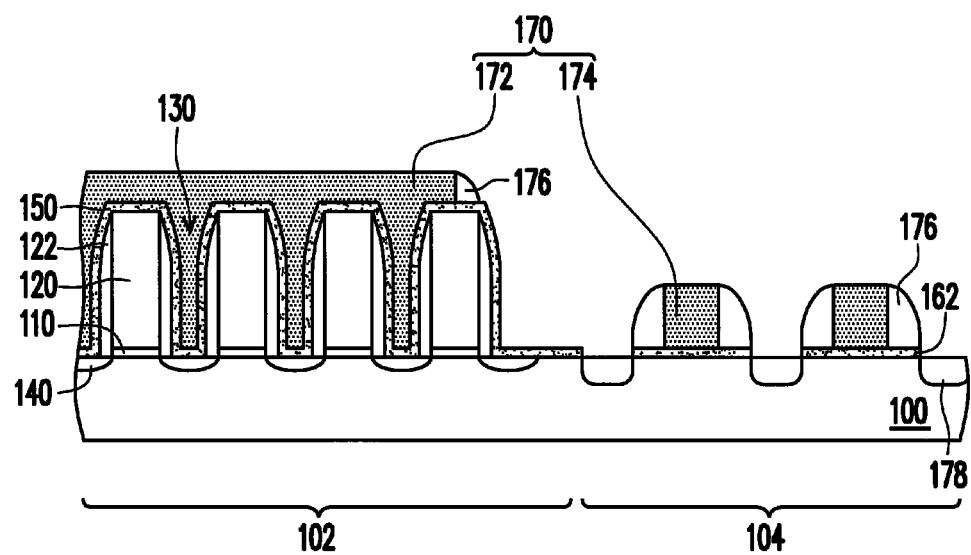

With reference to FIG. 1E, a spacer 176 is formed on a sidewall of each of the second gates 174 in the peripheral region 104. The spacers 176 are formed by deposition and etching, for instance, so as to form oxide that acts as the spacer 176 on the sidewall of each of the second gates 174. In this embodiment, the spacer 176 is further formed on the sidewall of the cover layer 172. The spacer 176 then serves as a mask to form a doped region 178 at two sides of each of the second gates 174.

Figure 1F:
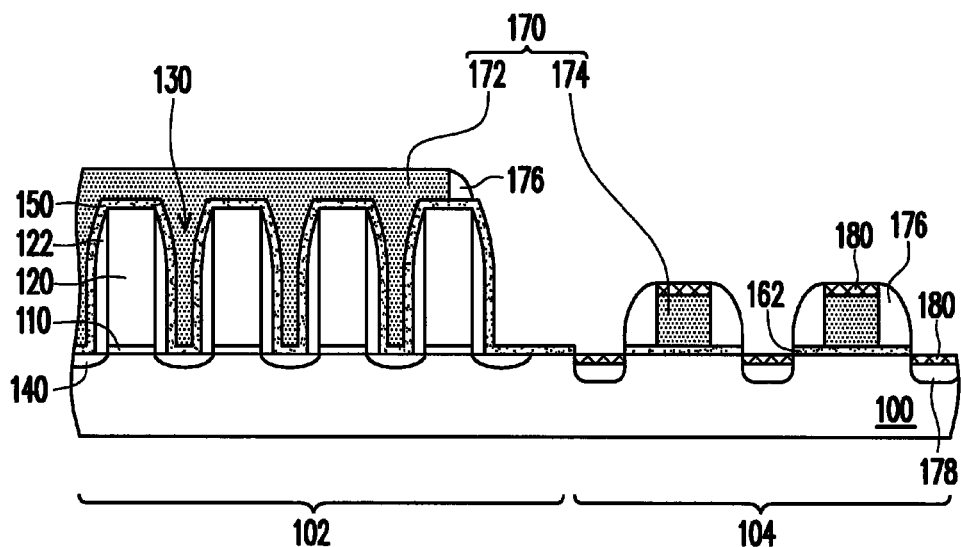

With reference to FIG. 1F, in this embodiment, a silicidation process is performed on each of the second gates 174 and each of the doped regions 178, so as to form a silicide layer 180 on a top portion of each of the second gates 174 and in each of the doped regions 178. In this embodiment, the silicide layer 180 is cobalt silicide, for instance. Note that a mask layer covers the memory region 102 when the silicidation process is performed on the gates 174 and the doped regions 178 in the peripheral region 104 according to this embodiment, and therefore the devices including the gates 120 in the memory region 102 are not silicidized. As such, electrical insulation between devices, e.g., word lines and the sources and drain regions, is not affected.

Figure 1G:
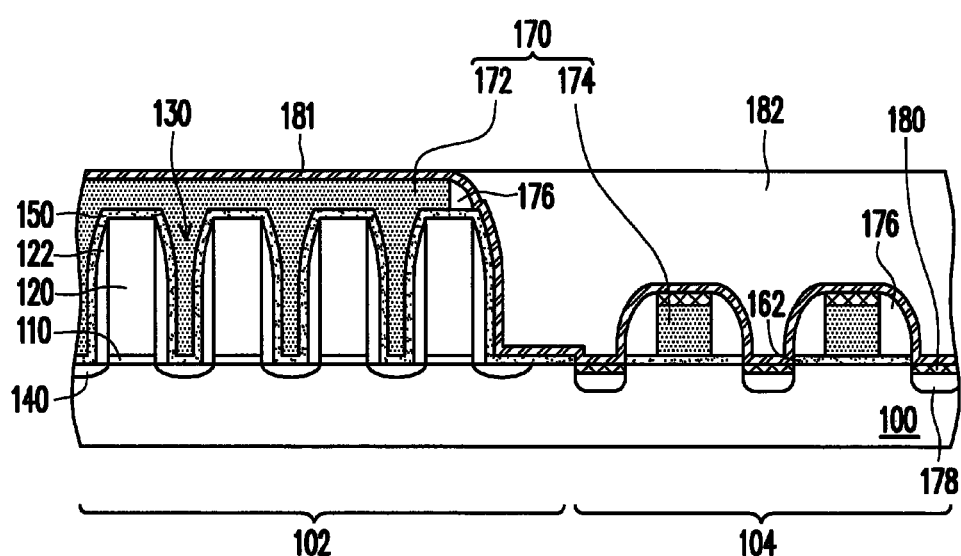

With reference to FIG. 1G, a barrier layer 181 is formed on the substrate 100 to cover the second gates 174 in the peripheral region 104 and the cover layer 172 in the memory region 102. A first material layer 182 is formed on the substrate 100 in the peripheral region 104. A material of the barrier layer 181 is, for instance, silicon nitride, and the barrier layer 181 is formed by CVD, for instance. A material of the first material layer 182 is, for instance, silicon oxide, and a method of forming the first material layer 182 is, for instance, CVD. According to this embodiment, a material layer that entirely covers the peripheral region 104 and the memory region 102 is formed on the substrate 100, and the material layer is planarized by using the barrier layer 181 in the memory region 102 as an etch stop layer, such that the top surface of the first material layer 182 and the top surface of the barrier layer 181 are approximately at the same height and substantially located on the same plane. The planarization process, for instance, includes a chemical mechanical polishing process.

Figure 1H:
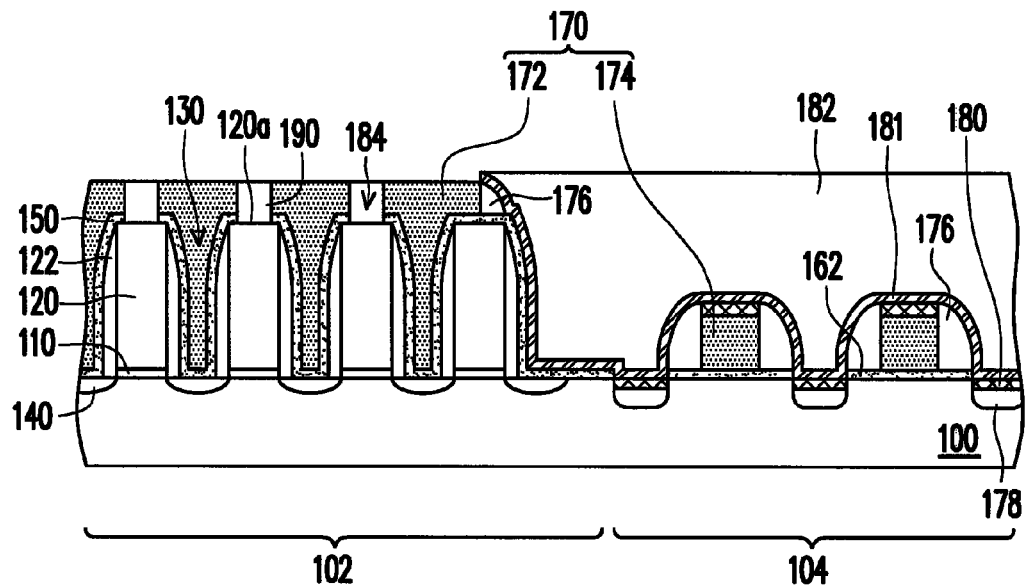

With reference to FIG. 1H, a portion of the barrier layer 181 in the memory region 102 and a portion of the cover layer 172 in the memory region 102 are removed to form a plurality of second openings 184. Each of the second openings 184 exposes a top portion 120a of one of the first gates 120. The portion of the barrier layer 181 and the portion of the cover layer 172 are removed by dry etching, for instance.

It should be mentioned that the gates 174 in the peripheral region 104 are covered by the first material layer 182 in the step of forming the second openings 184. Therefore, the gates 174 in the peripheral region 104 are not damaged when the portion of the cover layer 172 is etched. Accordingly, the portion of the cover layer 172 can be etched when favorable etching conditions are given, so as to form the second openings 184 with the vertical profile. For instance, in terms of etchant selection, whether the etchant can lead to high etching selectivity ratio of the cover layer 172 and the gates 174 should not be taken into consideration, while the etchant that allows the openings to have favorable profile should be selected for use.

A first pattern 190 is formed in each of the second openings 184. A material of the first pattern 190 includes borophosphosilicate glass, for instance, and the first pattern 190 is formed by CVD, for instance.

Figure 1I:
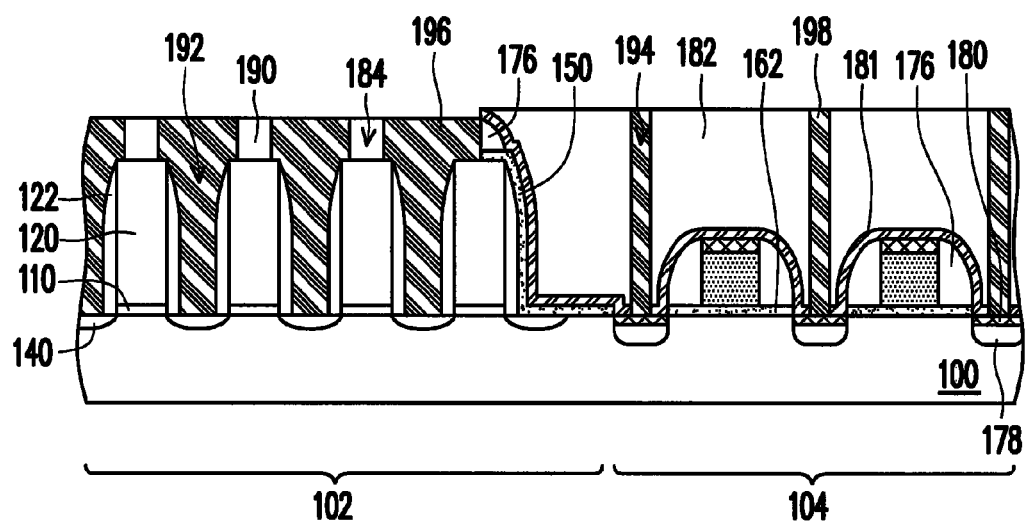

As indicated in FIG. 1I, the other portion of the cover layer 172 is removed, so as to form a plurality of contact openings 192 in the memory region 102. The other portion of the cover layer 172 is removed by dry etching or wet etching, for instance. A portion of the first material layer 182 in the peripheral region 104 is removed, so as to form the contact openings 194 in the peripheral region 104. The contact openings 194 expose the doped regions 178. The portion of the first material layer 182 is removed by dry etching or wet etching, for instance. Note that the silicidation process can be performed on the source and drain regions 140 after the cover layer 172 is removed. For instance, cobalt silicide can be formed on the surfaces of the source and drain regions 140.

A contact plug 196 is formed in each of the contact openings 192, and a contact plug 198 is formed in each of the contact openings 194. The first pattern 190 is configured between the contact plugs 196. The contact plugs 196 and 198 are made of tungsten, copper, aluminum, or any other appropriate metal, for instance.

According to the previous embodiments, it should be mentioned that the memory is formed by performing the SAC process depicted in FIG. 1F to FIG. 1I, for instance. However, in other embodiments of the invention, the contacts and the memory can be formed by performing other subsequent processes, which should not be construed as a limitation to the invention.

Generally, the devices in the memory region can be formed by performing thermal processes which are likely to impair the devices formed in the peripheral region. However, in this embodiment, when devices including the first gates, the source and drain regions, and the spacers are formed in the memory region, devices including the gates and the gate oxide layer are not formed in the peripheral region. Hence, the thermal process and the doping process performed in the memory region do not affect the characteristics of devices in the peripheral region. Thereby, the characteristics of devices in the peripheral region are not deteriorated, and boron penetration does not occur in the gate oxide layer. On the other hand, the manufacturing conditions are mainly determined based on the favorable device characteristics instead of considering the possible negative impact on the devices in the peripheral region, and thus the manufacturing conditions of the memory region can be optimized, and the characteristics of devices in the memory region can be improved. Moreover, when the silicidation process is performed on the gates and the doped regions in the peripheral region, devices including the gates and the source and drain regions in the memory region are covered and protected by the cover layer. Accordingly, the devices in the memory region are not silicidized, electrical insulation between devices, e.g., word lines and the sources and drain regions, is not affected, and the gates and the doped regions in the peripheral region can have optimal conductivity. That is to say, by applying the method of fabricating the memory, as described in the embodiments of the invention, the devices in both the peripheral region and the memory region can have favorable characteristics, and thereby the performance of the memory can be further improved.

It will be apparent to those skilled in the art that various modifications and variations can be made to the structure of the invention without departing from the scope or spirit of the invention. In view of the foregoing, it is intended that the invention cover modifications and variations of this invention provided they fall within the scope of the following claims and their equivalents.

What is claimed is:

1. A method of fabricating a memory, comprising:
   providing a substrate, the substrate comprising a memory region and a peripheral region, a plurality of first gates being formed in the memory region, a plurality of first openings being formed between the first gates;
   forming a nitride layer on the substrate in the memory region, the nitride layer covering the first gates and the first openings;
   forming an oxide layer on the substrate in the peripheral region;
   performing a nitridization process to nitridize the oxide layer into a nitridized oxide layer; and
   forming a conductive layer on the substrate, the conductive layer comprising a cover layer and a plurality of second gates, the cover layer being located on the substrate in the memory region, the second gates being located on the substrate in the peripheral region, wherein the cover layer covers the nitride layer, and the first openings are filled with the cover layer.

2. The method of fabricating the memory as recited in claim 1, further comprising:
   forming a barrier layer on the substrate to cover the second gates in the peripheral region and the cover layer in the memory region;
   forming a first material layer on the substrate in the peripheral region;
   removing one portion of the barrier layer and one portion of the cover layer in the memory region to form a plurality of second openings, each of the second openings exposing a top portion of one of the first gates;
   forming a first pattern in each of the second openings;
   removing the other portion of the cover layer to form a plurality of contact openings in the memory region; and
   forming a contact plug in each of the contact openings, wherein the first patterns are located between the contact plugs.

3. The method of fabricating the memory as recited in claim 1, further comprising forming a gate dielectric layer between each of the first gates and the substrate.

4. The method of fabricating the memory as recited in claim 1, further comprising forming a spacer on a sidewall of each of the first gates before the nitride layer is formed.

5. The method of fabricating the memory as recited in claim 1, further comprising forming a source and drain region at two sides of each of the first gates before the nitride layer is formed.

6. The method of fabricating the memory as recited in claim 1, wherein the nitridization process comprises a decoupled plasma nitridization process, a post-nitridization annealing process, or a nitrogen ion implantation process.

7. The method of fabricating the memory as recited in claim 1, wherein a material of the conductive layer comprises undoped polysilicon.

8. The method of fabricating the memory as recited in claim 1, further comprising forming a spacer on a sidewall of each of the second gates.

9. The method of fabricating the memory as recited in claim 1, further comprising forming a doped region at two sides of each of the second gates.

10. The method of fabricating the memory as recited in claim 9, further comprising performing a silicidation process on each of the second gates and each of the doped regions.

* * * * *